United States Patent [19]
Schlott et al.

[11] Patent Number: 5,531,948
[45] Date of Patent: Jul. 2, 1996

[54] PROCESS FOR THE PRODUCTION OF PARTIALLY REDUCED INDIUM OXIDE-TIN OXIDE TARGETS

[75] Inventors: Martin Schlott, Hanau; Martin Kutzner, Neuberg; Martin Weigert, Hanau; Wolfgang Dauth, Frankfurt am Main, all of Germany; Bruce Gehman, Morgan Hill, Calif.

[73] Assignee: Leybold Materials GmbH, Hanau, Germany

[21] Appl. No.: 384,181

[22] Filed: Feb. 6, 1995

[30] Foreign Application Priority Data

Apr. 18, 1994 [DE] Germany ............... 44 13 344.8

[51] Int. Cl.$^6$ ................................................. B29C 43/02
[52] U.S. Cl. ..................... 264/122; 264/65; 428/426; 501/134
[58] Field of Search ................. 419/6, 19, 48, 419/49; 257/449; 264/56, 61, 122, 65, DIG. 25; 428/426; 501/134

[56] References Cited

U.S. PATENT DOCUMENTS

| 4,690,745 | 9/1987 | Klein ............................ 204/192.29 |
| 4,820,393 | 4/1989 | Brat et al. ..................... 204/192.15 |
| 5,071,800 | 12/1991 | Iwamoto et al. ................. 501/126 |
| 5,094,787 | 3/1992 | Nakajima et al. ................ 264/65 |
| 5,160,675 | 11/1992 | Iwamoto et al. ................. 264/56 |
| 5,354,446 | 10/1994 | Kida et al. ................. 204/298.22 |
| 5,401,701 | 3/1995 | Ogawa et al. ................... 501/134 |

OTHER PUBLICATIONS

Powder Metallurgy Science, Randall M. German, Metal Powder Industries Federation, pp. 208–215.

*Primary Examiner*—Charles T. Jordan
*Assistant Examiner*—Daniel Jenkins
*Attorney, Agent, or Firm*—Felfe & Lynch

[57] ABSTRACT

The tin-containing component of a powder mixture includes SnO and is subjected to a mixing treatment with the $In_2O_3$ before compaction to adjust the degree of reduction of the sputtering target in a simple and reproducible manner.

5 Claims, No Drawings

PROCESS FOR THE PRODUCTION OF PARTIALLY REDUCED INDIUM OXIDE-TIN OXIDE TARGETS

BACKGROUND OF THE INVENTION

The invention pertains to a process for the production of partially reduced sputtering targets for cathodic evaporation based on powder mixtures of indium oxide and tin oxide by means of pressure-assisted sintering.

Oxide ceramic targets of indium oxide-tin oxide (ITO) are used for the production of thin, transparent, electrically conductive layers by cathodic evaporation (sputtering). Layers of this type find application primarily in flat-screen technology. The thin indium oxide-tin oxide layers can be produced either by the sputtering of metal targets in a reactive oxygen atmosphere or by the sputtering of oxide ceramic targets.

The sputtering process with oxide ceramic targets has the advantage that the oxygen flow in the sputtering chamber can be kept low, which makes it easier to control the sputtering process. When metal targets are used, the oxygen flow must be high, which makes process control more difficult. In comparison with completely oxidized targets of $In_2O_3+SnO_2$, targets which have a substoichiometric oxygen content offer the advantage that the oxygen content crucial to the conductivity of layer can be adjusted over a wider range during the deposition of the layer by sputtering. In addition, the working range, that is, the range of optimum layer conductivity as a function of the oxygen flow, is wider with these partially reduced targets than it is in the case of fully oxidized targets.

According to U.S. Pat. No. 4,690,745, indium oxide-tin oxide powder mixtures are hot-pressed under reducing conditions at 850°–1,000° C., during which the oxides are hot-pressed in a graphite hot-press mold or with the addition of carbon or carbon-releasing organic material. During the pressing step, the oxides are partially reduced, so that a target is created which contains less than the stoichiometric amount of oxygen.

The targets which can be obtained by means of this process have densities of <90% of the theoretical density (TD); they are also characterized by poor electrical conductivity ($\rho=0.1–0.6$ $\Omega$-cm) and insufficient mechanical stability. All three of these factors have a negative influence on the use of such targets for sputtering. In addition, it is difficult to adjust the degree of reduction in this process in a manner which is both reproducible and homogeneous over the entire extent of the target.

DE 41 24 471 describes a process for the production of ITO targets in which, through the use of pre-reduced powder, targets can be produced with a very uniform degree of reduction by means of hot-pressing or hot isostatic pressing. It has been found, however, that the step of reducing the powder is extremely time-consuming and cost-intensive. In addition, a great deal of effort is required to achieve a sufficient degree of reproducibility in the degree of reduction.

SUMMARY OF THE INVENTION

The present invention provides a process for the production of high-density, partially reduced indium oxide-tin oxide targets for cathodic evaporation in which the degree of reduction of the target can be adjusted in a simple and reproducible manner.

In accordance with the invention the tin-containing component consists at least partially of SnO and is subjected to a mixing treatment with the $In_2O_3$ prior to compaction. By means of the solution according to the invention, the complicated and difficult step of reducing the powder becomes unnecessary. In addition, the maintenance of a predetermined degree of reduction is simplified. This latter point offers significant advantages with respect to the production of the layer, because it means that it is possible to work under constant conditions during the production of the layer—the most important of these conditions being a constant oxygen flow during sputtering—so that the target shows a uniform degree of reduction overall. Further, the target composition is reproducible from target to target.

The surprising discovery was made that highly dense and mechanically stable targets can be produced by the pressure-assisted sintering of mixtures of $In_2O_3SnO_2$, and SnO, where the degree of reduction is defined as:

$$\frac{O_2[(1-x) \cdot In_2O_3 + x \cdot SnO_2] - O_2(\text{Target})}{O_2[(1-x) \cdot In_2O_3 + x \cdot SnO_2]} \cdot 100\%$$

where x is the weight portion of $SnO_2$ of the target consisting entirely of oxide, e.g. x=0.1 for ITO 90/10. The degree of reduction can be adjusted simply by the partial or complete replacement of $SnO_2$ with SnO. For the conventional stoichiometry of 90 wt. % $In_2O_3$+10 wt. % $SnO_2$, it is thus possible to arrive at degrees of reduction between 0 and 6.0%.

Mixing can be accomplished by conventional methods such as those based on roll mixers, V-mixers, ball mills, eccentric tumbler mixers, drum mixers, etc. Depending on the pourability of the powder, mixing can carried out either wet, e.g., with $H_2O$ or organic liquids, or dry. Pressure-assisted sintering can be carried out either in a hot press or in a hot isostatic press. Compacting should be carried out at 550°–1,200° C. at pressures of at least 100 bar (10 MPa). High densities are achieved preferably at pressures above 1,000 bar. The following examples are intended to explain the process according to the invention for producing the targets.

EXAMPLE 1

For a 6%-reduced ITO(10) mixture, 900 g of $In_2O_3$ and 89.4 g of SnO were mixed for 60 minutes in an eccentric tumbler mixer. The powder thus obtained was first subjected to a preliminary cold isostatic pressing and then compacted in a hot isostatic press in a lined steel can for 3 hours at 850° C. and 200 MPa. The indium oxide-tin oxide body had a density of 6.87 g/cm³ corresponding to 96% of the theoretical density, and had a degree of reduction of 5.9%. Mechanical processing could be carried out without difficulty. During the sputtering of the target, no arcing was observed. The sputtering rates were comparable to those found for other high-density, partially reduced ITO targets.

EXAMPLE 2

For a 6%-reduced ITO(10) mixture, 900 g of $In_2O_3$ and 89.4 g of SnO were mixed for 30 minutes in a ball mill with the addition of ceramic balls. The powder thus obtained was poured into graphite mold lined with boron nitride and then compacted at 900° C. under an argon atmosphere in a hot press at a maximum applied pressure of 18 MPa. The disk thus obtained had a density of 6.37 g/cm³ corresponding to 89% of the theoretical density The analyzed degree of reduction was 6.8%. Mechanical processing could be carried out without difficulty. During the sputtering of the target, only very scattered occurrences of arcing were observed. The sputtering rates were comparable to those found for other ITO targets of similar density.

EXAMPLE 3

For a 3%-reduced ITO(10) mixture, 900 g of $In_2O_3$, 50 g of $SnO_2$, and 44.7 g of SnO were mixed for 3 hours on a roller block in a drum. The powder thus obtained was first subjected to a preliminary cold isostatic pressing and then compacted in a hot isostatic press in a lined copper can at 750° C. and 200 MPa. The indium oxide-tin oxide body thus obtained had a density of 6.95 g/cm$^3$, corresponding to 97% of the theoretical density and had a degree of reduction of 2.9%. Mechanical processing could be carried out without difficulty. During the sputtering of the target, no arcing was observed. The sputtering rates were comparable to those found for other high-density, partially reduced ITO targets.

EXAMPLE 4

For a 3%-reduced ITO(5) mixture, 950 g of $In_2O_3$ and 44.7 g of SnO were mixed for 60 minutes in an eccentric tumbler mixer. The powder thus obtained was first subjected to a preliminary cold isostatic pressing and then compacted in a hot isostatic press in a lined steel can at 800° C. and 200 MPa. The indium oxide-tin oxide body thus obtained had a density of 6.94 g/cm$^3$, corresponding to 97% of the theoretical density and had a degree of reduction of 2.9%. Mechanical processing could be carried out without difficulty. During the sputtering of the target, no arcing was observed. The sputtering rates were comparable to those found for other high-density, partially reduced ITO targets.

EXAMPLE 5

For a 3%-reduced ITO(5) mixture, 950 g of $In_2O_3$ and 44.7 g SnO were mixed for 6 hours on a roller block in a drum. The powder thus obtained was then poured into a BN-coated graphite mold and compacted at 920° C. under an argon atmosphere in a hot press at a maximum applied pressure of 15 MPa. The disk thus obtained had a density of 6.23 g/cm$^3$, corresponding to 87% of the theoretical density. The degree of reduction was 4%. Mechanical processing could be carried out without difficulty. During the sputtering of the target, only scattered occurrences of arcing were observed. The sputtering rates were comparable to those found for other ITO targets of similar density.

What is claimed is:

1. Process for the production of a partially reduced indium oxide-tin-oxide target comprising preparing a powder mixture comprising SnO and $In_2O_3$, and sintering said mixture under an argon atmosphere in a hot press at an applied pressure above 10 MPa, up to a maximum of 18 MPa.

2. Process as in claim 1 wherein said powder mixture consists of SnO and $In_2O_3$.

3. Process as in claim 1 wherein said powder mixture further comprises $SnO_2$.

4. Process as in claim 3 wherein said powder mixture consists of SnO, $SnO_2$, and $In_2O_3$.

5. Partially reduced indium-tin-oxide sputtering target consisting of a homogenous sintered mixture comprising SnO and $In_2O_3$ .

* * * * *